United States Patent [19]
Cho

[11] Patent Number: 5,247,351
[45] Date of Patent: Sep. 21, 1993

[54] HIGH DEFINITION TELEVISION SYSTEM COMPATIBLE WITH NTSC SYSTEM

[75] Inventor: Hyeon-Deok Cho, Suwon, Rep. of Korea

[73] Assignee: SamSung Electronics Co., Ltd., Suwon, Rep. of Korea

[21] Appl. No.: 759,133

[22] Filed: Sep. 11, 1991

Related U.S. Application Data

[63] Continuation of Ser. No. 610,762, Nov. 8, 1990.

[30] Foreign Application Priority Data

Nov. 9, 1989 [KR] Rep. of Korea ............... 16195/1989

[51] Int. Cl.$^5$ .................. H04N 11/20; H04N 11/06
[52] U.S. Cl. ............................. 358/11; 358/12; 358/141
[58] Field of Search ................ 358/11, 12, 141

[56] References Cited

U.S. PATENT DOCUMENTS

| | | | |
|---|---|---|---|
| 4,564,857 | 1/1986 | LoCicero et al. | 358/11 |
| 4,605,950 | 8/1986 | Goldberg et al. | 358/11 |
| 4,794,456 | 12/1988 | Tsinberg | 358/11 |
| 4,800,426 | 1/1989 | Glenn | 358/12 |
| 4,888,641 | 12/1989 | Isnardi et al. | 358/12 |
| 4,907,069 | 3/1990 | Bretl | 358/12 |
| 4,989,091 | 1/1991 | Lucas | 358/11 |

Primary Examiner—Michael Razavi
Assistant Examiner—Wendy Greening
Attorney, Agent, or Firm—Robert E. Bushnell

[57] ABSTRACT

A HDTV system compatible with NTSC is accomplished by employing two channels for transmitting data. Since the channel I has low spatial definition+high time definition and the channel II has high spatial definition+low time definition, associating the channel I with the channel II produces high spatial definition+high time definition.

22 Claims, 4 Drawing Sheets

| O X X O X X O X X O X |
|---|
| O X X O X X O X X O X |
| O X X O X X O X X O X |
| O X X O X X O X X O X |

*FIG. 3A*

| O X X O X X O X X O X |
|---|
| O X X O X X O X X O X |
| O X X O X X O X X O X |

*FIG. 3B*

| X O X X O X X O X X O |
|---|
| X O X X O X X O X X O |
| X O X X O X X O X X O |
| X O X X O X X O X X O |

*FIG. 3C*

| X O X X O X X O X X O |
|---|
| X O X X O X X O X X O |
| X O X X O X X O X X O |

*FIG. 3D*

| X X O X X O X X O X X |
|---|
| X X O X X O X X O X X |
| X X O X X O X X O X X |
| X X O X X O X X O X X |

*FIG. 3E*

| X X O X X O X X O X X |
|---|
| X X O X X O X X O X X |
| X X O X X O X X O X X |

*FIG. 3F*

HIGH DEFINITION TELEVISION SYSTEM COMPATIBLE WITH NTSC SYSTEM

This is a continuation of application Ser. No. 07/610,762 filed on Nov. 8, 1990.

BACKGROUND OF THE INVENTION

The present invention relates to a high definition television system (HDTV System), particularly compatible with NTSC system.

Presently, the HDTV systems are largely classified into four classes, i.e., a system with one channel compatible with NTSC system, a spectrum-compatible system, a system with 1.5 or 2 channels compatible with NTSC system, and a system not compatible with NTSC system.

SUMMARY OF THE INVENTION

The object of the present invention is to provide a HDTV system compatible with NTSC system, wherein an additional signal of one channel is added to the NTSC signal.

According to one aspect of the present invention, the transmission part of a HDTV system comprises a television camera used for 60 Hz field frequency and 1050 lines two to one interlaced scanning, a matrix unit for transforming the red (R), green (G), and blue (B) signals of said camera into color difference signals (Y, I, Q), a first scan converter connected to the matrix unit to convert the 1050 lines two to one interlaced scanning signal to 525 lines two to one interlaced scanning signal, low pass filters for filtering the 525 interlaced scanning signal of the first scan converter, a second scan converter connected to the low pass filters to convert the 525 lines two to one interlaced scanning signal to the 1050 lines two to one interlaced scanning signal, a side panel rejector connected to the low pass filters to divide a side panel signal from a central panel signal, a time expanding and signal reproducing means connected to the side panel rejector for time expanding the separated signal of the rejector to reproduce a signal, a first NTSC encoder for encoding the output signal of the time expanding and signal reproducing means, a second NTSC encoder for encoding the output signal of the side panel rejector, multiple subtractors for subtracting the output signals of the second scan converter from the output signals of the matrix unit, a first frequency shifter for shifting the output frequencies of subtractors, a first signal reproducing means for reproducing the frequency-shifted signals from the first frequency shifter, and a third NTSC encoder for encoding the output signal of the first signal reproducing means.

According to another aspect of the present invention, the receiving part of the HDTV system comprises a first RF modulator for quadrature-modulating the output signals of the first and second NTSC encoders to transmit through channel I, a second RF modulator for quadrature-modulating the output signal of third NTSC encoder to transmit through channel II, a first RF demodulator for quadrature-demodulating the signal received through the channel I, a first NTSC decoder for decoding the side panel signal outputted from the first demodulator, a second NTSC decoder for decoding the central panel signal outputted from first demodulator, a time-compressing/signal reproducing means for time-compressing the output signal of the first decoder to reproduce a signal, a side panel injector for combining the output signals of the second decoder and the time-compressing/signal reproducing means, a third scan converter connected to the injector to convert the 525 lines two to one interlaced scanning signal to the 1050 lines two to one interlaced scanning signal, a second RF demodulator for quadrature-demodulating the signal received through the channel II, a third NTSC decoder for decoding the output signal of the second demodulator, a second signal reproducing means connected to the third NTSC decoder to convert the decoded 525 lines two to one interlaced scanning signal to the 1050 lines two to one interlaced scanning signal, a second frequency shifter for shifting the frequency of the output signal of the second signal reproducing means, multiple adders for adding the output signals of the third scan converter and second frequency shifter to produce Y, I, Q signals, a dematrix unit for transforming the Y, I, Q signals of the adders into R, G, B signals, and a display unit for displaying the R, G, B signals of dematrix unit.

The present invention will now be described more specifically with reference to the drawings attached only by way of example.

BRIEF DESCRIPTION OF THE ATTACHED DRAWINGS

FIGS. 3A-3F show signal reproduction per field according to the present invention;

DETAILED DESCRIPTION OF THE PREFERRED EMBODIMENT

Figure 1:
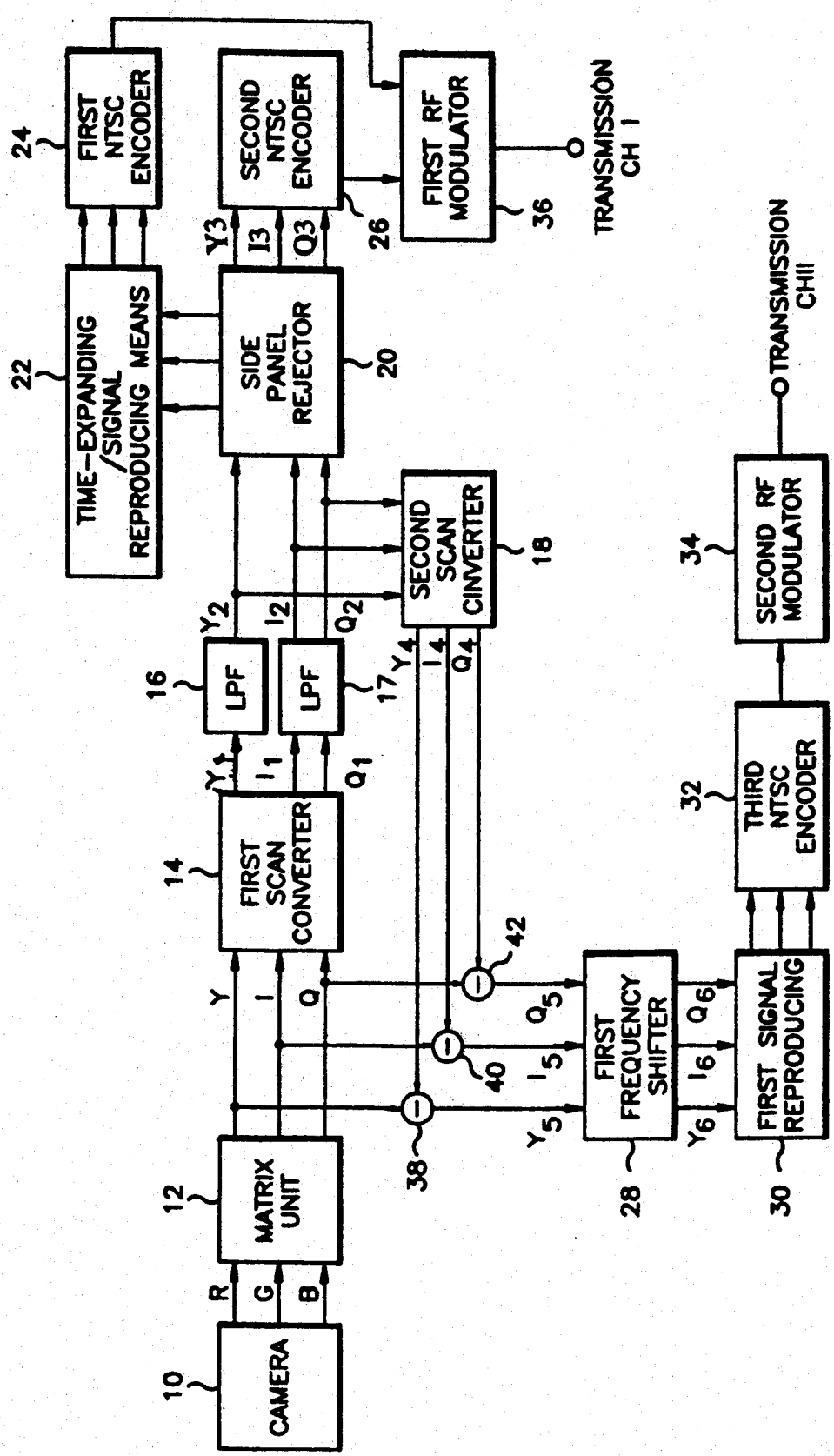
FIG. 1 is a block diagram for illustrating the encoding part of a HDTV system according to the present invention.

Referring to FIG. 1, a television camera 10 used for 60 Hz field frequency is to produce 1050 lines two to one interlaced scanning signal. A matrix unit 12 is to transform the Red (R), Green (G), and Blue (B) signals of the camera 10 into color difference signals (Y, I, Q). A first scan converter 14 is to convert the 1050 lines two to one interlaced scanning signal to 525 lines two to one interlaced scanning signal. A low pass filter 16 is to filter the Y signal of the output of the first scan converter 14, while a low pass filter 17 is to filter the I, Q signals thereof. A second scan converter 18 is to convert the 525 lines two to one interlaced scanning signal into the 1050 lines two to one interlaced scanning signal. A side panel rejector 20 is to divide a side panel signal from a central panel signal. A time expanding and signal reproducing means 22 is to time-expand the side panel signal to reproduce a signal. First, second and third NTSC encoders 24, 26 and 32 are to encode the signal. Subtractors 38, 40, 42 are to subtract the output signal of the second scan convertor 18 from the output signal of the matrix unit 12. A first frequency shifter 28 is to shift the output frequency of subtractors 38, 40, 42. A first signal reproducing means 30 is to reproduce the frequency-shifted signals of the first frequency shifter 28. A first RF modulator 36 is to quadrature-modulate the output signals of the first and second NTSC encoders 24, 26 to transmit through channel I. A second RF modulator 34 is to quadrature-modulate the output signal of the third NTSC encoder 32 to transmit through channel II.

Figure 2:
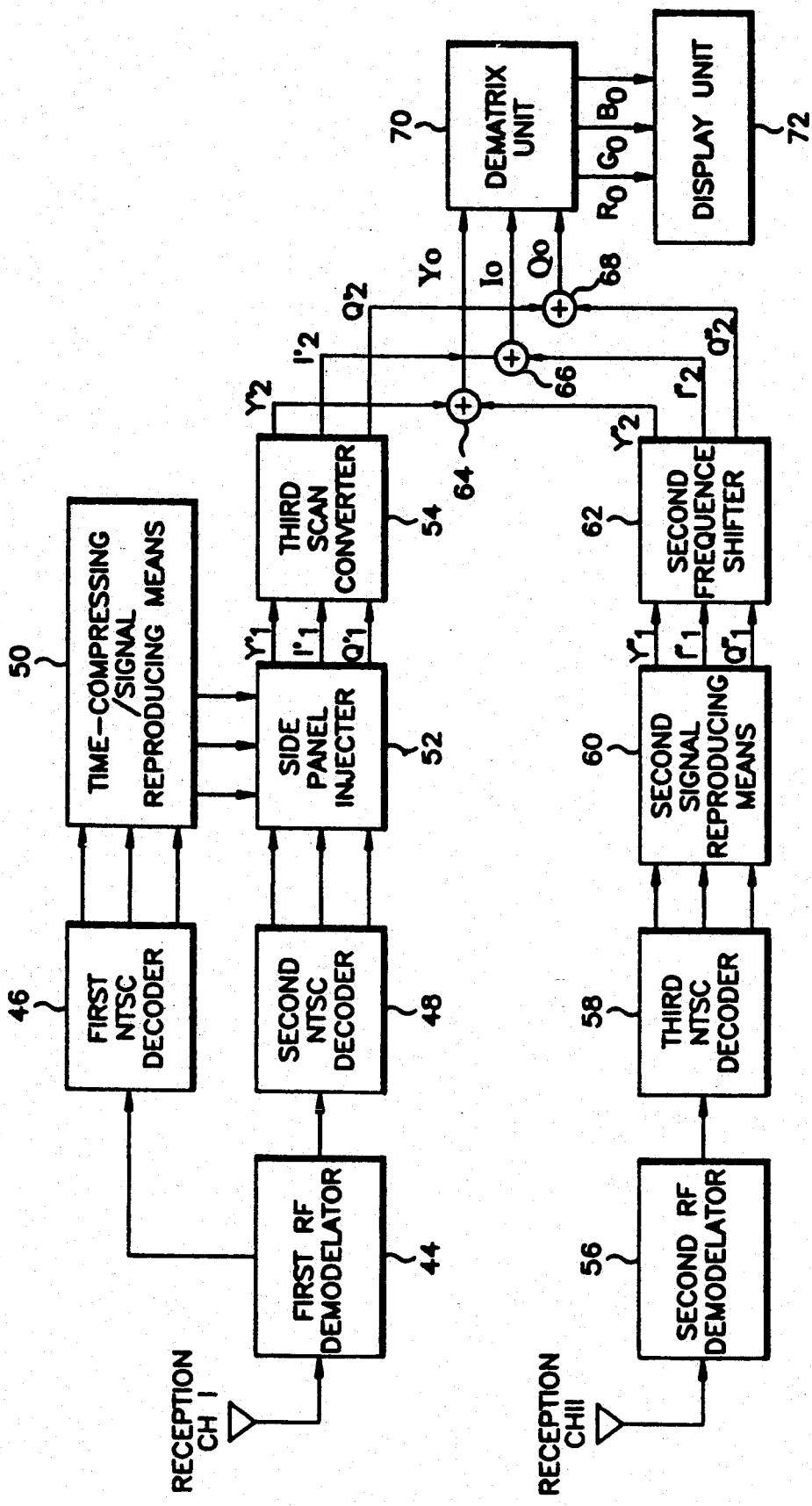
FIG. 2 is a block diagram for illustrating the decoding part of a HDTV system according to the present invention.

Referring to FIG. 2, a first RF demodulator 44 is to quadrature-demodulate the signal received through the channel I into an RF signal. A time-compressing/signal reproducing means 50 is to time-compress the output signal of the first NTSC decoder 46 to reproduce a signal. A side panel injector 52 is to combine the output signals of the second NTSC decoder 48 and the time-compressing/signal reproducing means 50. A third scan converter 54 is to convert the 525 lines two to one interlaced scanning signal into the 1050 lines two to one interlaced scanning signal. A second RF demodulator 56 is to demodulate the signal received through the channel II into an RF signal. A third NTSC decoder 58 is to decode the RF demodulated signal of the second demodulator 56. A second signal reproducing means 60 is to reproduce the output signal of the third NTSC decoder 58. A second frequency shifter 62 is to shift the frequency of the output signal of the second signal reproducing means 60. Adders 64, 66, 68 are to mix the signals outputted from the third scan convert 54 and second frequency shifter 62. A dematrix unit 70 is to transform the signals outputted from the adders 64, 66, 68 into the R. G. B signals. A display unit 72 is to display the R, G, B signals of the dematrix unit 70.

Describing more specifically the embodiment with reference to FIGS. 1 to 5, the 1050 lines two to one interlaced scanning signals R, G, B outputted from the camera 10 are transformed by the matrix unit 12 into the Y, I, Q signals as follows:

$$\begin{pmatrix} Y \\ I \\ Q \end{pmatrix} = \begin{pmatrix} 0.30 & 0.59 & 0.11 \\ 0.60 & -0.28 & -0.32 \\ 0.21 & 0.31 & -0.52 \end{pmatrix} \begin{pmatrix} R \\ G \\ B \end{pmatrix}$$

The Y, I, Q signals of the matrix unit 12 are converted by the first scan converter 14 from the 1050 lines two to one interlaced scanning format into the 525 lines two to one interlaced scanning format. The output signal $Y_1$ of the first scan converter 14 is filtered by the 5.46 MHz low pass filter 16, while the output signals $I_1$ and $Q_1$ of the first scan converter 14 are filtered by the 0.65 MHz low pass filter 17. The output signals $Y_2$, $I_2$, $Q_2$ of the low pass filters 16, 17 are applied to the second scan converter 18, while also applied to the side panel rejector 20 to be separated as shown in FIG. 4.

Figure 4:
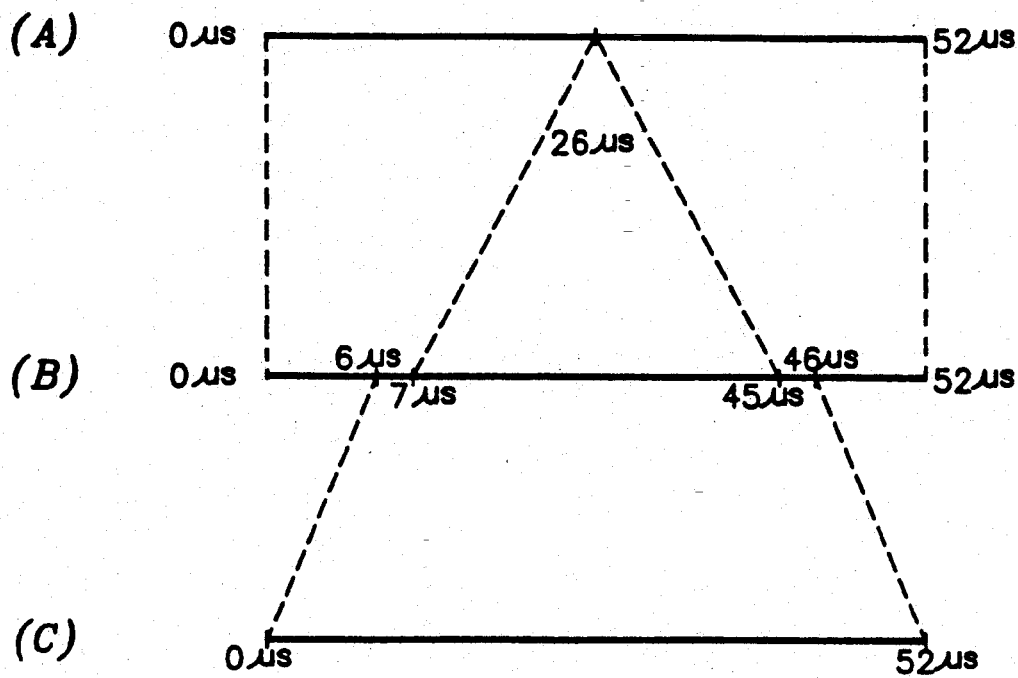
FIG. 4 is a diagram of a signal transformation produced by side panel rejector and time-expanding/signal reproducing means according to the present invention.

Namely, referring to FIG. 4, if the signal b is input to the side panel rejector 20, the portions of 0 to 7 $\mu$s and 45 $\mu$s to 52 $\mu$s of the signal are applied to the time-expanding/signal reproducing means 22, while the other portion of 6 to 46 $\mu$s is time-expanded as shown in FIG. 4c. The bandwidth of this time-expanded signal is, respectively, 4.2 MHz, 0.5 MHz and 0.5 MHz, and applied to the second NTSC encoder 26 from the side panel rejector 20.

Meanwhile, the portions of 0 to 7 $\mu$s and 45 to 52 $\mu$s applied to the time-expanding/signal reproducing means 22 are respectively time-expanded into the portions of 0 to 26 $\mu$s and 26 to 52 $\mu$s as shown in FIG. 4a, input to the first NTSC encoder 24. The first RF modulator 36 quadrature-phase-modulates the output signals of the first and second NTSC encoders 24 and 2 into a same phase, transmitting through the channel I.

The output signals of the matrix unit 12 are applied to subtractors 38, 40, 42, having the bandwidths of Y=36 MHz, Q=4.3 MHz and I=4.3MHz. The second scan converter 18 converts the output signals $Y_2$, $I_2$, $Q_2$ of the low pass filters 16, 17 into the 1050 lines two to one interlaced scanning signals. Namely, the frequency bands of the output signals of the second scan converter respectively have two times the output signals of the low pass filters, so that $Y_4$ is 10.92 MHz, and $I_4$ and $Q_4$ are 1.3 MHz. The subtractors 38, 40 and 42 subtract the output signal of the second scan converter 18 from the output signal of the matrix unit 12. Thus, the output signals $Y_5$, $I_5$ and $Q_5$ of the subtractors 38, 40 and 42 respectively have the values of 36MHz-10.92 MHz, 4.3MHz-1.3MHz and 4.3MHz-1.3MHz, inputted to the first frequency shifter to produce an output of which $Y_6$ is 0-25 MHz, and $I_6$ and $Q_6$ are 0-3 MHz.

The output signals of the first frequency shifter are vertically sub-sampled by the first signal reproducing means 30 to transform the 1050 lines two to one interlaced scanning signals into the 525 lines two to one interlaced scanning signals so as to produce signals as shown in FIG. 3. Namely, one of three samples is selected as shown in FIG. 3a in the first field so as to only transmit even line, while, in the second field, one of three samples is selected as shown in FIG. 3b so as to only transmit odd line. In this manner, if the data is transmitted up through the sixth field, the transmission of one frame data is completed.

Hence, the signal is formed in the NTSC format without deteriorating the definition in the spatial direction although the definition is deteriorated in the direction of time. The signal thus constructed is transmitted via the third NTSC encoder 32 and second RF modulator 34 to the channel II. Consequently, the NTSC signal and side panel signal are transmitted through the channel I, and the definition component signal through the channel II, so that the HDTV receiver receives and combines all the signals through the both channels I and II to obtain the High Definition. The signal characteristics of the channel I show Y'=0~10.92 MHz, I'=Q'=1.3 MHz, and the frame frequency=30 Hz, while the signal characteristics of the channel II show Y''=36 MHz~10.92 MHz, I''=Q''=4.3 MHz~1.3 MHz, and the frame frequency=10 Hz. Although the signals are separated from each other as described above, the image quality is hardly affected, for a definition exchange method is employed. Namely, since the channel I has low spatial definition+high time definition and the channel II has high spatial definition+low time definition, associating the channel I with the channel II produces high spatial definition+high time definition.

Figure 5:
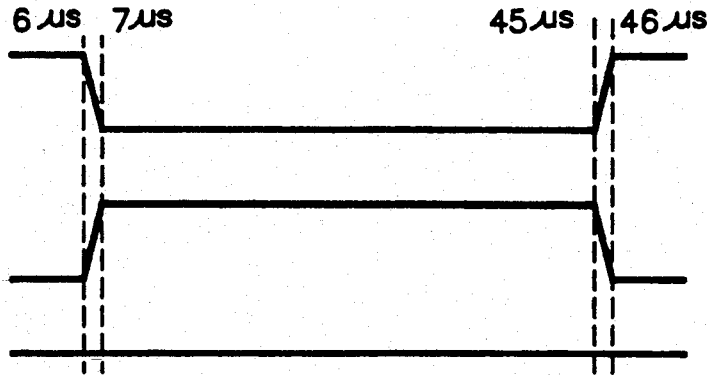
FIG. 5 is a waveform for illustrating the operation of the inventive HDTV system.

The decoding part of FIG. 2 functions in opposite to the encoding part of FIG. 1. The signals of the channels I and II are respectively received by the first and second RF demodulators 44 and 56. The first RF demodulator 44 quadrature-phase-demodulates the signal received through the channel I, applying the side panel signal to the first NTSC decoder 46 and the central panel signal to the second NTSC decoder 48. The first NTSC decoder 46 decodes the received signal to transform it (see FIG. 4a) into the signal of 0-7 $\mu$s and 45-52 $\mu$s (see FIG. 4b) applied to the time-compressing/signal reproducing means 50. The output signal of the second NTSC decoder 48 is input to the side panel injector 52, so that the signal c of FIG. 4 is transformed into the signal b of 6 $\mu$s to 46 $\mu$s. The side panel injector 52 combines the output signals of the second NTSC decoder 48 and time-compressing/signal reproducing means 50. Here, the portion of 6 $\mu$s to 7 $\mu$s and the portion of 45 $\mu$s to 46 $\mu$s get overlapped. These portions are to prevent the image distortion caused by mismatching the side panel signal with the central signal. Hence, these portions are linearly compensated as shown in FIG. 5.

The third scan converter 54 converts the 525 lines two to one interlaced scanning signal $Y'_1$, $I'_1$, $Q'_1$ output from the side panel injector 52 into the 1050 lines two to one interlaced scanning signal $Y'_2$, $I'_2$, $Q'_2$. Meanwhile, the second RF demodulator 56 quadrature-phase-demodulates the signal received through the channel II. The output of the second RF demodulator is decoded by the third NTSC decoder 58 into the format as shown in FIG. 3.

This signal is interlaced into the 525 lines two to one interlaced signal by the second signal reproducing means 60. Of the interlaced signal, the frequency band of the $Y''_1$ signal is 12.6 MHz, and that of the $I''_1$ and $Q''_1$ signals are 1.5 MHz. If the above signals are line-interpolated, the frequency band of the $Y''_1$ signal becomes 25.2 MHz, and that of the $I''_1$ and $Q''_1$ signals become 3 MHz. The second frequency shifter 62 shifts the output signals $Y''_1$, $I''_1$ and $Q''_1$ of the second signal reproducing means 60 to the signals of which the $Y''_2$ signal has the frequency band of 10.92 MHz to 36 MHz with the frequency band of the $I''_2$ and $Q''_2$ being 1.3 to 4.3 MHz. The first, second and third adders 64, 66, 68 add the output signals $Y'_2$, $I'_2$ and $Q'_2$ of the third scan converter 54 and the output signals $Y''_2$, $I''_2$ and $Q''_2$ of second frequency shifter 62 to produce the signal of which the $Y_0$ signal has the frequency band of 0 to 36 MHz with the frequency band of the $I_0$ and $Q_0$ signals being 0 to 4.3 MHz. The dematrix unit 70 transforms the $Y_0$, $I_0$, $Q_0$ signals of the adders 64, 66, 68 into the $R_0$, $G_0$, $B_0$ signals as follows:

$$\begin{pmatrix} R_0 \\ G_0 \\ B_0 \end{pmatrix} = \begin{pmatrix} 0.30 & 0.59 & 0.11 \\ 0.60 & -0.28 & -0.32 \\ 0.21 & 0.31 & -0.52 \end{pmatrix} \begin{pmatrix} Y_0 \\ I_0 \\ Q_0 \end{pmatrix}$$

The output of the dematrix unit 70 is displayed by the display unit 72. The frame displayed comprises a highly defined 1050 lines two to one interlaced scanning signals whose luminance band and chrominance band are respectively 36 MHz and 4.3 MHz.

As stated above, the present invention accomplishes a HDTV system compatible with NTSC by employing two channels for transmitting data.

What is claimed is:

1. A high definition television system, comprising:
   a camera for 60 Hz field frequency and 1050 lines two to one interlaced scanning;
   a matrix unit for transforming the red, green, and blue signals of said camera into color difference signals;
   a first scan converter, coupled to said matrix unit, for converting said 1050 lines two to one interlaced scanning signal to 525 lines two to one interlaced scanning signal;
   low pass filters for filtering the 525 interlaced scanning signal of said first scan converter;
   a second scan converter, coupled to said low pass filter, for converting the 525 lines two to one interlaced scanning signal to the 1050 lines two to one interlaced scanning signal;
   a side panel rejector, coupled to said low pass filters, for dividing a side panel signal from a central signal;
   time expanding/signal reproducing means, coupled to said side channel rejector, for time-expanding the separated signal of said rejector to reproduce a signal;
   a first NTSC encoder for encoding the output signal of said time-expanding/signal reproducing means;
   a second NTSC encoder for encoding the output signal of said side panel rejector;
   multiple subtractors for subtracting the output signals of said second scan converter from the output signals of said matrix unit;
   a first frequency shifter for shifting the output frequencies of said subtractors;
   first signal reproducing means for reproducing the frequency-shifted signals of said first frequency shifter;
   a third NTSC encoder for encoding the output signal of said first signal reproducing means;
   a first RF modulator for quadrature-phase-modulating the output signals of said first and second NTSC encoders to transmit through channel I;
   a second RF modulator for quadrature-phase-modulating the output signal of said third NTSC encoder to transmit through channel II;
   a first RF demodulator for quadrature-phase-modulating the signal received through said channel I;
   a first NTSC decoder for decoding the side channel signal output from said first demodulator;
   a second NTSC decoder for decoding the center signal output from said first demodulator;
   time-compressing/signal reproducing means for time-compressing the output signal of said first decoder to reproduce a signal;
   a side panel injector for combining the output signals of said second decoder and said time-compressing/signal reproducing means;
   a third scan converter, coupled to said injector, for convert the 525 lines two to one interlaced scanning signal to the 1050 lines two to one interlaced scanning signal;
   a second RF demodulator for quadrature-phase-demodulating the signal received through the channel II;
   a third NTSC decoder for decoding the output signal of said second demodulator;
   second signal reproducing means, coupled to said third NTSC decoder, for convert the decoded 525 lines two or one interlaced scanning signal to the 1050 lines two to one interlaced scanning signal;
   a second frequency shifter for shifting the frequency of the output signal of said second signal reproducing means;
   multiple adders for adding the output signals of said third scan converter and second frequency shifter to produce $Y_0$, $G_0$, $Q_0$ signals;
   a dematrix unit for transforming the $Y_0$, $I_0$, $Q_0$ signals of said adders into $R_0$, $G_0$, $B_0$ signals; and
   a display unit for displaying the $R_0$, $G_0$, $B_0$ signals of said dematrix unit.

2. A transmission apparatus for a compatible high definition television, comprising:
   camera means for providing a plurality of color signals in a first format having a first predetermined number of scanning lines per picture;

matrix means for transforming said plurality of color signals into a plurality of color difference signals;

first scan converter means for receiving said plurality of color difference signals, and for converting said plurality of color difference signals in said first format into a plurality of color difference signals in a second format having a second predetermined number of scanning lines per picture;

filter means for providing a filtered plurality of lines color difference signals by filtering said plurality of color difference signals in said second format;

second scan converter means for receiving said filtered plurality of color difference signals and for converting said filtered plurality of color difference signals in said second format into a filtered plurality of color difference signals in the first format;

side panel rejector means for receiving said filtered plurality of color difference signals in said second format to provide a side panel signal and a time expanded central signal;

time expander means for time-expanding said side panel signal to provide a first reproduced signal;

first encoder means for providing a first encoded reproduced signal by encoding said first reproduced signal;

second encoder means for providing an encoder time expanded central signal by encoding said time expanded central signal;

first modulator means for receiving said first encoded reproduced signal and said encoded time-expanded central signal for quadrature-phase-modulation to provide a first image signal to be transmitted via a first transmission channel;

subtractor means for subtracting said filtered plurality of color difference signals in the first format from said plurality of color difference signals in said first format to provide a second plurality of color difference signals;

first frequency shifter means for providing a frequency-shifted second plurality of color difference signals by shifting the frequencies of said second plurality of color difference signals;

first signal reproducing means for receiving said frequency-shifted second plurality of color difference signals in said first format to provide a reproduced signal in the second format;

third encoder means for providing a second encoder reproduced signal by encoding said second reproduced signals in said second format; and second modulator for receiving said second reproduced signals in said second format for quadrature-phase-modulation to provide a second image signal to be transmitted via a second transmission channel.

3. The compatible high definition television system of claim 2, wherein said first format is a high definition format comprises color difference signals having 1050 scanning lines per picture, two-to-one interlaced ratio, and a 60 Hertz field frequency.

4. The compatible high definition television system of claim 2, wherein said second format is a standard format comprises color difference signals having 525 scanning lines per picture and two-to-one interlaced ratio.

5. A method for transmitting and receiving a compatible high definition television image, comprising the steps of:

converting an original image into a plurality of color signals in a first format having a first predetermined number of scanning lines per picture;

transforming said plurality of color signals into a plurality of color difference signals;

converting said plurality of color difference signals in said first format to a plurality of color difference signals in a second format having a second predetermined number of scanning lines per picture;

low pass filtering said plurality of color difference signals in said second format;

converting the filtered plurality of color difference signals in said second format to the filtered plurality of color difference signals in the first format;

providing a side panel signal and a time expanded central signal from said filtered plurality of color difference signals in said second format;

time-expanding said side panel signal to provide a first reproduced signal;

encoding said first reproduced signal and said time expanded central signal;

quadrature-phase-modulating the first encoded reproduced signal and the encoded time expanded central signal to provide a first image signal to be transmitted vi a first transmission channel;

subtracting said filtered plurality of color difference signals in the first format from said plurality of color difference signals in said first format to provide a second plurality of color difference signals;

shifting the frequencies of said second plurality of color difference signals to provide a frequency-shifted second plurality of color difference signals;

converting said frequency-shifted second plurality of color difference signals in said first format to a second reproduced signal in the second format;

encoding said second reproduced signals;

quadrature-phase-modulating the second encoded reproduced signals in said second format to provide a second image signal to be transmitted via a second transmission channel;

quadrature-phase-demodulating said first image signal from said first transmission channel in the second format to provide the first encoded reproduced signal and the encoded time-expanded central signal;

decoding the first encoded reproduced signal and the encoded time-expanded central signal to provide the reproduced signal and the time-expanded central signal;

time-compressing said reproduced signal to reproduce the side panel signal;

recombining said side panel signal to said time-expanded central signal to provide the plurality of color difference signals in the second format;

converting said plurality of color difference signals in the second format to the plurality of color difference signals in the first format;

quadrature-phase-demodulating said second image signal from said second transmission channel to provide the second encoded reproduced signal in the second format;

decoding said second encoded reproduced signal to provide the second reproduced signal;

converting said second reproduced signal in said second format to provide the frequency-shifted second plurality of color difference signals in the first format;

shifting the frequency of said frequency-shifted second plurality of color difference signals to provide the second plurality of color difference signals;

adding said second plurality of color difference signals in said first format to said plurality of color difference signals in said first format to provide a third plurality of color difference signals in said first format; and transforming said third plurality of color difference signals into said plurality of color signals;

reconverting said plurality of color signals in said first format into the original image.

6. The method of claim 5, wherein said first format is a high definition format comprises color difference signals having 1050 scanning lines per picture, two-to-one interlaced ratio, and a 60 Hertz field frequency.

7. The method of claim 5, wherein said second format is a standard format comprises color difference signals having 525 scanning lines per picture and two-to-one interlaced ratio.

8. A compatible high definition television system, comprising:

matrix means for transforming color signals exhibiting a first format having a first predetermined number of scanning lines per picture, into a plurality of color difference signals;

first scan converter means for receiving said plurality of color difference signals, and for converting said plurality of color difference signals in said first format to a first plurality of color difference signals in a second format having a second predetermined number of scanning lines per picture;

filter means for providing a filtered plurality of color difference signals by filtering said first plurality of color difference signals in said second format at a predetermined bandwidth;

second scan converter means for receiving said filtered plurality of color difference signals, and for converting said filtered plurality of color difference signals in said second format to a filtered plurality of color difference signals in the first format;

side panel rejector means for receiving said filtered plurality of color difference signals in the second format to provide a side panel signal and a time expanded central signal;

time expander means for time-expanding said side panel signal to provide a first reproduced signal;

first encoder means for providing a first encoded reproduced signal by encoding said first reproduced signal;

second encoder means for providing an encoded time expanded central signal by encoding said time expanded central signal;

first modulator means for receiving said first encoded reproduced signal and said encoded time-expanded central signal for quadrature-phase-modulation to provide a first image signal to be transmitted via a first transmission channel;

subtractor means for subtracting said filtered plurality of color difference signals in the first format from said plurality of color difference signals in said first format to provide a second plurality of color difference signals in said first format;

first frequency shifter means for providing a frequency-shifted second plurality of color difference signals by shifting the frequencies of said second plurality of color difference signals in said first format;

first signal reproducing means for receiving said frequency-shifted second plurality of color difference signals in said first format to provide a second reproduced signal in the second format;

third encoder means for providing a second encoded reproduced signal by encoding said second reproduced signal in said second format;

second modulator for receiving said second encoded reproduced signal in said second format for quadrature-phase-modulation to provide a second image signal to be transmitted via a second transmission channel;

first demodulator means for receiving said first image signal from said first transmission channel in the second format for quadrature-phase-demodulation to provide the first encoded reproduced signal and the encoded time-expanded central signal;

first decoder means for providing the first reproduced signal by decoding the first encoded reproduced signal;

second decoder means for providing the central signal by decoding the encoded time-expanded central signal;

time compressor means for time-compressing said first reproduced signal to reproduce the side panel signal;

side panel injector means for combining said side panel signal with said central signal to provide the plurality of color difference signals in the second format;

third scan converter means for converting said plurality of color difference signals in the second format to the plurality of color difference signals in the first format;

second demodulator means for receiving said second image signals from said second transmission channel in the first format for quadrature-phase-demodulation to provide the second encoded reproduced signal;

third decoder means for providing the second reproduced signal by decoding said second encoded reproduced signal;

second signal reproducing means for receiving said second reproduced signal in said second format to provide the frequency-shifted second plurality of color difference signals in the first format;

second frequency shifter means for providing the second plurality of color difference signal by shifting the frequency of said frequency-shifted second plurality of color difference signals in said first format;

adder means for providing a third plurality of color difference signals in said first format by adding said plurality of color difference signals to said second plurality of color difference signals; and dematrix means for transforming said third plurality of color difference signals into the color signals exhibiting said first format.

9. The compatible high definition television system of claim 8, wherein said first format is a high definition format comprising color difference signals having 1050 scanning lines per picture, two-to-one interlaced ratio, and a 60 Hz field frequency.

10. The compatible high definition television system of claim 8, wherein said second format is a standard definition format comprising color difference signals having 525 scanning lines per picture and two-to-one interlaced ratio.

11. The compatible high definition television system of claim 10, wherein said standard format is the system proposed by the U.S. National Television System Committee (NTSC).

12. A compatible high definition television system, comprising:
   means for transforming color signals into a first plurality of color difference signals in a first format having a first predetermined number of scanning lines per picture;
   first scan converter means for receiving said first plurality of color difference signals, and for converting said first plurality of color difference signals in the first format to a first plurality of color difference signals in a second format having a second predetermined number of scanning lines per picture;
   filter means for providing a first filtered of color difference signals by filtering said first plurality of color difference signals in said second format at a predetermined bandwidth;
   second scan converter means for receiving said first filtered plurality of color difference signals, and for converting said first filtered plurality of color difference signals in said second format to a first filtered plurality of color difference signals in the first format;
   side panel rejector means for receiving said first filtered plurality of color difference signals in the second format to provide a side panel signal and a time expanded central signal;
   time expander means for time-expanding said side panel signal to provide a reproduced signal;
   means for encoding and quadrature-phase-modulating said reproduced signal and said time expanded central signal to provide a first image signal to be transmitted via a first transmission channel;
   subtractor means for subtracting said first filtered plurality of color difference signals in the first format from said first plurality of color difference signals in said first format to provide a second plurality of color difference signals in said first format;
   first reproducing means for receiving said second plurality of color difference signals in said first format to provide a second reproduced signal in the second format;
   means for encoding and quadrature-phase-modulating said second reproduced signal in said second format to provide a second image signal to be transmitted via a second transmission channel;
   means for receiving said first image signal from said first transmission channel in the second format for quadrature-phase-demodulating and decoding said first image signal to provide the reproduced signal and the time-expanded central signal;
   time compressor means for time-compressing said reproduced signal to reproduce the side panel signal;
   side panel injector means for combining said side panel signal with said time-expanded central signal to provide a third plurality of color difference signals in the second format;
   third scan converter means for converting said third plurality of color difference signals in the second format to the third plurality of color difference signals in the first format;
   means for receiving said second image signals from said second transmission channel in the second format for quadrature-phase-demodulating and decoding said second image signals to provide the second reproduced signal;
   second reproducing means for receiving said second reproduced signal in said second format to provide the second plurality of color difference signals in the first format;
   adder means for adding said second and third plurality of color difference signals in the first format to provide a fourth plurality of color difference signals in said first format; and
   dematrix means for transforming said fourth plurality of color difference signals into said original color signals exhibiting said first format.

13. The compatible high definition TV system of claim 12, wherein said first format having a first predetermined number of scanning lines per picture is a high definition format comprising color difference signals having 1050 scanning lines per picture, two-to-one interlaced ratio, and 60 Hz field frequency.

14. The compatible high definition TV system of claim 12, wherein said second format having a second predetermined number of scanning lines per picture is a standard format comprising color difference signals having 525 scanning lines per picture and two-to-one interlaced ratio, and said standard format is the system proposed by the U.S. National Television System Committee (NTSC).

15. The compatible high definition TV system of claim 12, wherein said first and fourth plurality of color difference signals are identical, each comprises luminance component in the range of 0 MHz to 36 MHz and color difference components in the range of 0 MHz to 4.3 MHz.

16. The compatible high definition TV system of claim 12, wherein said first reproducing means comprises frequency shifter means for receiving and shifting the frequency of said second plurality of color difference signals in the first format to provide first frequency-shifted color difference signals, and signal reproducing means for vertically sub-sampling and transforming said first frequency-shifted color difference signals into the second reproduced signal in the second format.

17. The compatible high definition TV system of claim 16, wherein said second reproducing means comprises signal reproducing means for receiving the second reproduced signal in the second format to reproduce second frequency-shifted color difference signals, and frequency shifter means for shifting the frequency of said second frequency-shifted color difference signals to provide the second plurality of color difference signals.

18. The compatible high definition TV system of claim 12, wherein said first image signal at said first transmission channel is a high temporal definition signal having signal characteristics of a luminance component in the range of 0 MHz to 10.92 MHz, color difference components of 1.3 MHz, and the frame frequency of 30 Hz; and said second image signal at a second transmission channel is a high spatial definition signal having signal characteristics of a luminance component in the range of 36 MHz to 10.92 MHz, color difference components in the range of 4.3 MHz to 1.3 MHz, the frame frequency of 10 Hz.

19. The compatible high definition TV system of claim 18, wherein said first image signal at said first transmission channel is a high temporal definition signal, having signal characteristics of a luminance component in the range of 0 MHz to 10.92 MHz, color difference components of 1.3 MHz, and the frame frequency of 30 Hz; and said second image signal at a second transmission channel is a high spatial definition signal having signal characteristics of a luminance component in the range of 36 MHz to 10.92 MHz, color difference components in the range of 4.3 MHz to 1.3 MHz, the frame frequency of 10 Hz.

20. A receiver apparatus for a compatible high definition television system, for restoring a first image signal having high temporal definition components being transmitted via a first transmission channel and a second image signal having high spatial definition components being transmitted via a second transmission channel, comprising:

means for receiving a first image signal in a first format having a first predetermined number of scanning lines per picture from said first transmission channel for quadrature-phase-demodulating and decoding said first image signal to provide a reproduced signal and a time-expanded central signal;

time compressor means for time-compressing said reproduced signal to reproduce a side panel signal;

side panel injector means for combining said side panel signal with said time-expanded central signal to provide a first plurality of color difference signals in said first format;

scan converter means for converting said first plurality of color difference signals in said first format to a second plurality of color difference signals in a second format having a second predetermined number of scanning lines per picture;

means for receiving said second image signals in said first format having said first predetermined number of scanning lines per picture from said second transmission channel for quadrature-phase-demodulating said decoding said second image signals to provide a second reproduced signal;

reproducing means for receiving said second reproduced signal in said first format to provide a second plurality of color difference signals in said second format;

adder means for adding said first and second plurality of color difference signals in said second format to provide a third plurality of color difference signal in said second format; and dematrix means for transforming said third plurality of color difference signals in said second format into color signals exhibiting high spatial definition and high temporal definition.

21. The receiver as claimed in claim 20, wherein said first format having a first predetermined number of scanning lines per picture is a standard format comprising color difference signals having 525 scanning lines per picture and two-to-one interlaced ratio, and said standard format is the system proposed by the U.S. National Television System Committee (NTSC).

22. The receiver as claimed in claim 20, wherein said second format having a second predetermined number of scanning lines per picture is a high definition format comprising color difference signals having 1050 scanning lines per picture, two-to-one interlaced ratio, and 60 Hz field frequency.

* * * * *

UNITED STATES PATENT AND TRADEMARK OFFICE
CERTIFICATE OF CORRECTION

PATENT NO. : 5,247,351
DATED : September 21, 1993
INVENTOR(S) : Hyeon-Deok Cho

It is certified that error appears in the above-indentified patent and that said Letters Patent is hereby corrected as shown below:

Column 7, line 49, replace "second encoder" with --second encoded--.
Column 11, line 18, after "first filtered" insert --plurality--.
Column 14, line 15, change "signal" to --signals--.
Column 3, line 67, change "2" to --26--.
Column 4, line 15, change "inputted" to --input--.

Signed and Sealed this

Ninth Day of August, 1994

Attest:

BRUCE LEHMAN

*Attesting Officer*  *Commissioner of Patents and Trademarks*